US006991977B2

(12) United States Patent
Kocon

(10) Patent No.: US 6,991,977 B2
(45) Date of Patent: Jan. 31, 2006

(54) METHOD FOR FORMING A SEMICONDUCTOR STRUCTURE WITH IMPROVED SMALLER FORWARD VOLTAGE LOSS AND HIGHER BLOCKING CAPABILITY

(75) Inventor: Christopher Boguslaw Kocon, Plains, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/666,034

(22) Filed: Sep. 18, 2003

(65) Prior Publication Data

US 2004/0063269 A1 Apr. 1, 2004

Related U.S. Application Data

(62) Division of application No. 09/981,583, filed on Oct. 17, 2001, now Pat. No. 6,677,641.

(51) Int. Cl.
*H01L 21/8238* (2006.01)

(52) U.S. Cl. ........................ 438/206; 438/212; 438/268

(58) Field of Classification Search ................. 438/197, 438/206, 212, 268
See application file for complete search history.

(56) References Cited

U.S. PATENT DOCUMENTS

| | | | |
|---|---|---|---|
| 3,404,295 | A | 10/1968 | Warner et al. |
| 3,412,297 | A | 11/1968 | Amlinger |
| 3,497,777 | A | 2/1970 | Teszner et al. |
| 3,564,356 | A | 2/1971 | Wilson |
| 3,660,697 | A | 5/1972 | Berglund et al. |
| 4,003,072 | A | 1/1977 | Matsushita et al. |

(Continued)

FOREIGN PATENT DOCUMENTS

| | | | |
|---|---|---|---|
| CN | 1036666 | A | 10/1989 |
| DE | 4300806 | C1 | 12/1993 |
| DE | 19736981 | A1 | 8/1998 |
| EP | 0975024 | A2 | 1/2000 |
| EP | 1026749 | A1 | 8/2000 |

(Continued)

OTHER PUBLICATIONS

Bai et al., "Novel automated optimization of power MOSFET for 12V input, high–frequency DC–DC converter," *International Symposium on Power Semiconductors and ICs, Technical Digest*, (2003), pp. 366–369.

Baliga "New Concepts in Power Rectifiers," Physics of Semiconductor Devices, Proceedings of the Third Int'l Workshop, Madras (India), Committee on Science and Technology in Developing Countries (1985), pp. 471–481.

Baliga "Options for CVD of Dielectrics Include Low–k Materials," Technical Literature from Semiconductor International, Jun. 1998, 4 pages total.

Baliga et al., "Improving the reverse recovery of power MOSFET integral diodes by electron irradiation," (Dec. 1983) *Solid State Electronics*, vol. 26, No. 12, pp. 1133–1141.

(Continued)

*Primary Examiner*—Long Pham
(74) *Attorney, Agent, or Firm*—Townsend and Townsend and Crew LLP

(57) ABSTRACT

A semiconductor device is formed as follows. A semiconductor substrate having a first region of a first conductivity type is provided. A region of a second conductivity type is formed in the semiconductor substrate such that the first and second regions form a p-n junction. First and second charge control electrodes are formed adjacent to but insulated from one of the first and second regions, along a dimension parallel to flow of current through the semiconductor device, wherein the first charge control electrode is adapted to be biased differently than the second charge control electrode.

9 Claims, 8 Drawing Sheets

U.S. PATENT DOCUMENTS

| | | | |
|---|---|---|---|
| 4,300,150 | A | 11/1981 | Colak |
| 4,326,332 | A | 4/1982 | Kenney |
| 4,337,474 | A | 6/1982 | Yukimoto |
| 4,345,265 | A | 8/1982 | Blanchard |
| 4,445,202 | A | 4/1984 | Goetze et al. |
| 4,579,621 | A | 4/1986 | Hine |
| 4,636,281 | A | 1/1987 | Buiguez et al. |
| 4,638,344 | A | 1/1987 | Cardwell, Jr. |
| 4,639,761 | A | 1/1987 | Singer et al. |
| 4,698,653 | A | 10/1987 | Cardwell, Jr. |
| 4,716,126 | A | 12/1987 | Cogan |
| 4,746,630 | A | 5/1988 | Hui et al. |
| 4,754,310 | A | 6/1988 | Coe |
| 4,774,556 | A | 9/1988 | Fujii et al. |
| 4,801,986 | A | 1/1989 | Chang et al. |
| 4,821,095 | A | 4/1989 | Temple |
| 4,823,176 | A | 4/1989 | Baliga et al. |
| 4,853,345 | A | 8/1989 | Himelick |
| 4,868,624 | A | 9/1989 | Grung et al. |
| 4,893,160 | A | 1/1990 | Blanchard |
| 4,914,058 | A | 4/1990 | Blanchard |
| 4,941,026 | A | 7/1990 | Temple |
| 4,967,245 | A | 10/1990 | Cogan et al. |
| 4,969,028 | A | 11/1990 | Baliga |
| 4,974,059 | A | 11/1990 | Kinzer |
| 4,990,463 | A | 2/1991 | Mori |
| 4,992,390 | A | 2/1991 | Chang |
| 5,027,180 | A | 6/1991 | Nishizawa et al. |
| 5,034,785 | A | 7/1991 | Blanchard |
| 5,071,782 | A | 12/1991 | Mori |
| 5,072,266 | A | 12/1991 | Bulucea et al. |
| 5,079,608 | A | 1/1992 | Wodarczyk et al. |
| 5,105,243 | A | 4/1992 | Nakagawa et al. |
| 5,111,253 | A | 5/1992 | Korman et al. |
| 5,142,640 | A | 8/1992 | Iwamatsu |
| 5,164,325 | A | 11/1992 | Cogan et al. |
| 5,164,802 | A | 11/1992 | Jones et al. |
| 5,168,973 | A | 12/1992 | Asayama et al. |
| 5,216,275 | A | 6/1993 | Chen |
| 5,219,777 | A | 6/1993 | Kang |
| 5,219,793 | A | 6/1993 | Cooper et al. |
| 5,233,215 | A | 8/1993 | Baliga |
| 5,262,336 | A | 11/1993 | Pike, Jr. et al. |
| 5,268,311 | A | 12/1993 | Euen et al. |
| 5,275,965 | A | 1/1994 | Manning |
| 5,294,824 | A | 3/1994 | Okada |
| 5,298,761 | A | 3/1994 | Aoki et al. |
| 5,300,447 | A | 4/1994 | Anderson |
| 5,326,711 | A | 7/1994 | Malhi |
| 5,350,937 | A | 9/1994 | Yamazaki et al. |
| 5,365,102 | A | 11/1994 | Mehrotra et al. |
| 5,366,914 | A | 11/1994 | Takahashi et al. |
| 5,389,815 | A | 2/1995 | Takahashi |
| 5,405,794 | A | 4/1995 | Kim |
| 5,418,376 | A | 5/1995 | Muraoka et al. |
| 5,424,231 | A | 6/1995 | Yang |
| 5,429,977 | A | 7/1995 | Lu et al. |
| 5,430,311 | A | 7/1995 | Murakami et al. |
| 5,430,324 | A | 7/1995 | Bencuya |
| 5,436,189 | A | 7/1995 | Beasom |
| 5,438,215 | A | 8/1995 | Tihanyi |
| 5,442,214 | A | 8/1995 | Yang |
| 5,454,435 | A | 10/1995 | Reinhardt |
| 5,473,176 | A | 12/1995 | Kakumoto |
| 5,473,180 | A | 12/1995 | Ludikhuize |
| 5,474,943 | A | 12/1995 | Hshieh et al. |
| 5,519,245 | A | 5/1996 | Tokura et al. |
| 5,541,425 | A | 7/1996 | Nishihara |
| 5,554,862 | A | 9/1996 | Omura et al. |
| 5,567,634 | A | 10/1996 | Hebert et al. |
| 5,567,635 | A | 10/1996 | Acovic et al. |
| 5,572,048 | A | 11/1996 | Sugawara |
| 5,576,245 | A | 11/1996 | Cogan et al. |
| 5,578,851 | A | 11/1996 | Hshieh et al. |
| 5,581,100 | A | 12/1996 | Ajit |
| 5,583,065 | A | 12/1996 | Miwa |
| 5,592,005 | A | 1/1997 | Floyd et al. |
| 5,595,927 | A | 1/1997 | Chen et al. |
| 5,597,765 | A | 1/1997 | Yilmaz et al. |
| 5,605,852 | A | 2/1997 | Bencuya |
| 5,616,945 | A | 4/1997 | Williams |
| 5,623,152 | A | 4/1997 | Majumdar et al. |
| 5,629,543 | A | 5/1997 | Hshieh et al. |
| 5,637,898 | A | 6/1997 | Baliga |
| 5,639,676 | A | 6/1997 | Hshieh et al. |
| 5,640,034 | A | 6/1997 | Malhi |
| 5,648,670 | A | 7/1997 | Blanchard |
| 5,656,843 | A | 8/1997 | Goodyear et al. |
| 5,665,619 | A | 9/1997 | Kwan et al. |
| 5,670,803 | A | 9/1997 | Beilstein, Jr. et al. |
| 5,689,128 | A | 11/1997 | Hshieh et al. |
| 5,693,569 | A | 12/1997 | Ueno |
| 5,705,409 | A | 1/1998 | Witek |
| 5,710,072 | A | 1/1998 | Krautschneider et al. |
| 5,714,781 | A | 2/1998 | Yamamoto et al. |
| 5,719,409 | A | 2/1998 | Singh et al. |
| 5,744,372 | A | 4/1998 | Bulucea |
| 5,770,878 | A | 6/1998 | Beasom |
| 5,776,813 | A | 7/1998 | Huang et al. |
| 5,780,343 | A | 7/1998 | Bashir |
| 5,801,417 | A | 9/1998 | Tsang et al. |
| 5,814,858 | A | 9/1998 | Williams |
| 5,877,528 | A | 3/1999 | So |
| 5,879,971 | A | 3/1999 | Witek |
| 5,879,994 | A | 3/1999 | Kwan et al. |
| 5,895,951 | A | 4/1999 | So et al. |
| 5,895,952 | A | 4/1999 | Darwish et al. |
| 5,897,343 | A | 4/1999 | Mathew et al. |
| 5,897,360 | A | 4/1999 | Kawaguchi |
| 5,900,663 | A | 5/1999 | Johnson et al. |
| 5,906,680 | A | 5/1999 | Meyerson |
| 5,917,216 | A | 6/1999 | Floyd et al. |
| 5,929,481 | A | 7/1999 | Hshieh et al. |
| 5,943,581 | A | 8/1999 | Lu et al. |
| 5,949,104 | A | 9/1999 | D'Anna et al. |
| 5,949,124 | A | 9/1999 | Hadizad et al. |
| 5,959,324 | A | 9/1999 | Kohyama |
| 5,960,271 | A | 9/1999 | Wollesen et al. |
| 5,972,741 | A | 10/1999 | Kubo et al. |
| 5,973,360 | A | 10/1999 | Tihanyi |
| 5,973,367 | A | 10/1999 | Williams |
| 5,981,344 | A | 11/1999 | Hshieh et al. |
| 5,981,996 | A | 11/1999 | Fujishima |
| 5,998,833 | A | 12/1999 | Baliga |
| 6,005,271 | A | 12/1999 | Hshieh |
| 6,008,097 | A | 12/1999 | Yoon et al. |
| 6,011,298 | A | 1/2000 | Blanchard |
| 6,015,727 | A | 1/2000 | Wanlass |
| 6,020,250 | A | 2/2000 | Kenney |
| 6,034,415 | A | 3/2000 | Johnson et al. |
| 6,037,202 | A | 3/2000 | Witek |
| 6,037,628 | A | 3/2000 | Huang |
| 6,037,632 | A | 3/2000 | Omura et al. |
| 6,040,600 | A | 3/2000 | Uenishi et al. |
| 6,048,772 | A | 4/2000 | D'Anna |
| 6,049,108 | A | 4/2000 | Williams et al. |
| 6,057,558 | A | 5/2000 | Yamamoto et al. |
| 6,063,678 | A | 5/2000 | D'Anna |
| 6,064,088 | A | 5/2000 | D'Anna |
| 6,066,878 | A | 5/2000 | Neilson |
| 6,069,043 | A | 5/2000 | Floyd et al. |

| | | | |
|---|---|---|---|
| 6,081,009 | A | 6/2000 | Neilson |
| 6,084,264 | A | 7/2000 | Darwish |
| 6,084,268 | A | 7/2000 | de Frésart et al. |
| 6,087,232 | A | 7/2000 | Kim et al. |
| 6,096,608 | A | 8/2000 | Williams |
| 6,097,063 | A | 8/2000 | Fujihira |
| 6,103,578 | A | 8/2000 | Uenishi et al. |
| 6,104,054 | A | 8/2000 | Corsi et al. |
| 6,110,799 | A | 8/2000 | Huang |
| 6,114,727 | A | 9/2000 | Ogura et al. |
| 6,150,697 | A | 11/2000 | Teshigahara et al. |
| 6,156,606 | A | 12/2000 | Michaelis |
| 6,156,611 | A | 12/2000 | Lan et al. |
| 6,163,052 | A | 12/2000 | Liu et al. |
| 6,165,870 | A | 12/2000 | Shim et al. |
| 6,168,983 | B1 | 1/2001 | Rumennik et al. |
| 6,168,996 | B1 | 1/2001 | Numazawa et al. |
| 6,171,935 | B1 | 1/2001 | Nance et al. |
| 6,174,773 | B1 | 1/2001 | Fujishima |
| 6,174,785 | B1 | 1/2001 | Parekh et al. |
| 6,184,545 | B1 | 2/2001 | Werner et al. |
| 6,184,555 | B1 | 2/2001 | Tihanyi et al. |
| 6,188,104 | B1 | 2/2001 | Choi et al. |
| 6,188,105 | B1 | 2/2001 | Kocon et al. |
| 6,190,978 | B1 | 2/2001 | D'Anna |
| 6,191,447 | B1 | 2/2001 | Baliga |
| 6,194,741 | B1 | 2/2001 | Kinzer et al. |
| 6,198,127 | B1 | 3/2001 | Kocon |
| 6,201,279 | B1 | 3/2001 | Pfirsch |
| 6,204,097 | B1 | 3/2001 | Shen et al. |
| 6,207,994 | B1 | 3/2001 | Rumennik et al. |
| 6,222,233 | B1 | 4/2001 | D'Anna |
| 6,225,649 | B1 | 5/2001 | Minato |
| 6,228,727 | B1 | 5/2001 | Lim et al. |
| 6,239,463 | B1 | 5/2001 | Williams et al. |
| 6,239,464 | B1 | 5/2001 | Tsuchitani et al. |
| 6,265,269 | B1 | 7/2001 | Chen et al. |
| 6,271,100 | B1 | 8/2001 | Ballantine et al. |
| 6,271,552 | B1 | 8/2001 | D'Anna |
| 6,271,562 | B1 | 8/2001 | Deboy et al. |
| 6,274,904 | B1 | 8/2001 | Tihanyi |
| 6,274,905 | B1 | 8/2001 | Mo |
| 6,277,706 | B1 | 8/2001 | Ishikawa |
| 6,281,547 | B1 | 8/2001 | So et al. |
| 6,285,060 | B1 | 9/2001 | Korec et al. |
| 6,291,298 | B1 | 9/2001 | Williams et al. |
| 6,291,856 | B1 | 9/2001 | Miyasaka et al. |
| 6,294,818 | B1 | 9/2001 | Fujihira |
| 6,297,534 | B1 | 10/2001 | Kawaguchi et al. |
| 6,303,969 | B1 | 10/2001 | Tan |
| 6,307,246 | B1 | 10/2001 | Nitta et al. |
| 6,309,920 | B1 | 10/2001 | Laska et al. |
| 6,313,482 | B1 | 11/2001 | Baliga |
| 6,316,806 | B1 | 11/2001 | Mo |
| 6,326,656 | B1 | 12/2001 | Tihanyi |
| 6,337,499 | B1 | 1/2002 | Werner |
| 6,346,464 | B1 | 2/2002 | Takeda et al. |
| 6,346,469 | B1 | 2/2002 | Greer |
| 6,351,018 | B1 | 2/2002 | Sapp |
| 6,353,252 | B1 | 3/2002 | Yasuhara et al. |
| 6,359,308 | B1 | 3/2002 | Hijzen et al. |
| 6,362,112 | B1 | 3/2002 | Hamerski |
| 6,362,505 | B1 | 3/2002 | Tihanyi |
| 6,365,462 | B2 | 4/2002 | Baliga |
| 6,365,930 | B1 | 4/2002 | Schillaci et al. |
| 6,368,920 | B1 | 4/2002 | Beasom |
| 6,368,921 | B1 | 4/2002 | Hijzen et al. |
| 6,376,314 | B1 | 4/2002 | Jerred |
| 6,376,878 | B1 | 4/2002 | Kocon |
| 6,376,890 | B1 | 4/2002 | Tihanyi |
| 6,384,456 | B1 | 5/2002 | Tihanyi |
| 6,388,286 | B1 | 5/2002 | Baliga |
| 6,388,287 | B2 | 5/2002 | Deboy et al. |
| 6,400,003 | B1 | 6/2002 | Huang |
| 6,429,481 | B1 | 8/2002 | Mo et al. |
| 6,433,385 | B1 | 8/2002 | Kocon et al. |
| 6,436,779 | B2 | 8/2002 | Hurkx et al. |
| 6,437,399 | B1 | 8/2002 | Huang |
| 6,441,454 | B2 | 8/2002 | Hijzen et al. |
| 6,452,230 | B1 | 9/2002 | Boden, Jr. |
| 6,461,918 | B1 | 10/2002 | Calafut |
| 6,465,304 | B1 | 10/2002 | Blanchard et al. |
| 6,465,843 | B1 | 10/2002 | Hirler et al. |
| 6,465,869 | B2 | 10/2002 | Ahlers et al. |
| 6,472,678 | B1 | 10/2002 | Hshieh et al. |
| 6,472,708 | B1 | 10/2002 | Hshieh et al. |
| 6,475,884 | B2 | 11/2002 | Hshieh et al. |
| 6,476,443 | B1 | 11/2002 | Kinzer |
| 6,479,352 | B2 | 11/2002 | Blanchard |
| 6,489,652 | B1 | 12/2002 | Jeon et al. |
| 6,501,146 | B1 | 12/2002 | Harada |
| 6,566,804 | B1 * | 5/2003 | Trujillo et al. ............. 313/495 |
| 6,580,123 | B2 | 6/2003 | Thapar |
| 6,608,350 | B2 | 8/2003 | Kinzer et al. |
| 6,677,641 | B2 | 1/2004 | Kocon |
| 2001/0023961 | A1 | 9/2001 | Hsieh et al. |
| 2001/0028083 | A1 | 10/2001 | Onishi et al. |
| 2001/0032998 | A1 | 10/2001 | Iwamoto et al. |
| 2001/0041400 | A1 | 11/2001 | Ren et al. |
| 2001/0049167 | A1 | 12/2001 | Madson |
| 2001/0050394 | A1 | 12/2001 | Onishi et al. |
| 2002/0009832 | A1 | 1/2002 | Blanchard |
| 2002/0014658 | A1 | 2/2002 | Blanchard |
| 2002/0066924 | A1 | 6/2002 | Blanchard |
| 2002/0070418 | A1 | 6/2002 | Kinzer et al. |
| 2002/0100933 | A1 | 8/2002 | Marchant |
| 2003/0060013 | A1 | 3/2003 | Marchant |
| 2003/0132450 | A1 | 7/2003 | Minato et al. |
| 2003/0193067 | A1 | 10/2003 | Kim |

FOREIGN PATENT DOCUMENTS

| | | | |
|---|---|---|---|
| EP | 1054451 | A2 | 11/2000 |
| EP | 0747967 | B1 | 2/2002 |
| EP | 1205980 | A1 | 5/2002 |
| JP | 56-058267 | A | 5/1981 |
| JP | 62-069562 | | 3/1987 |
| JP | 63-186475 | | 8/1988 |
| JP | 63-288047 | | 11/1988 |
| JP | 64-022051 | | 1/1989 |
| JP | 01-192174 | A | 8/1989 |
| JP | 05-226638 | A | 9/1993 |
| JP | 2000-040822 | | 2/2000 |
| JP | 2000-040872 | | 2/2000 |
| JP | 2000-156978 | A | 6/2000 |
| JP | 2000-277726 | A | 10/2000 |
| JP | 2000-277728 | A | 10/2000 |
| JP | 2001-015448 | | 1/2001 |
| JP | 2001-015752 | | 1/2001 |
| JP | 2001-102577 | A | 4/2001 |
| JP | 2001-111041 | A | 4/2001 |
| JP | 2001-135819 | A | 5/2001 |
| JP | 2001-144292 | A | 5/2001 |
| JP | 2001-244461 | A | 9/2001 |
| JP | 2001-313391 | A | 12/2001 |
| JP | 2002-083976 | A | 3/2002 |
| WO | WO 00/33386 | A2 | 6/2000 |
| WO | WO 00/68997 | A1 | 11/2000 |
| WO | WO 00/68998 | A1 | 11/2000 |
| WO | WO 00/75965 | A2 | 12/2000 |
| WO | WO 01/06550 | A1 | 1/2001 |
| WO | WO 01/06557 | A1 | 1/2001 |
| WO | WO 01/45155 | A1 | 6/2001 |

| | | | |
|---|---|---|---|
| WO | WO 01/59847 A2 | | 8/2001 |
| WO | WO 01/71815 | | 9/2001 |
| WO | WO 01/95385 A1 | | 12/2001 |
| WO | WO 01/95398 A1 | | 12/2001 |
| WO | WO 02/01644 A2 | | 1/2002 |
| WO | WO 02/047171 A1 | | 6/2002 |

OTHER PUBLICATIONS

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275–278.

Bulucea "Trench DMOS Transistor Technology For High Current (100 A Range) Switching" Solid–State Electronics vol. 34 No. pp. 493–507 (1991).

Chang et al. "Numerical and experimental Analysis of 500–V Power DMOSFET with an Atomic–Lattice Layout," IEEE Transactions on Electron Devices 36:2623 (1989).

Chang et al. "Self–Aligned UMOSFET's with a Specific On–Resistance of 1mΩ cm$^2$," IEEE Transactions on Electron Devices 34:2329–2334 (1987).

Cheng et al., "Fast reverse recovery body diode in high–voltage VDMOSFET using cell–distributed schottky contacts," (May 2003) *IEEE Transactions on Electron Devices*, vol. 50, No. 5, pp. 1422–1425.

"CoolMOS™ the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W–Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) *Proc. IEEE Power Electronics Specialist Conf.* (*PESC*), pp. 1248–1254.

Fujihira "Theory of Semiconductor Superjunction Devices" Jpn. J. Appl. Phys. vol. 36 pp. 6254–6262 (1997).

Gan et al. "Poly Flanked VDMOS (PFVDMOS): A Superior Technology for Superjunction Devices," IEEE Power Electronics Specialists Conference, Jun. 17–22, 2001, Vancouver, Canada (2001), 4 pages total.

Glenn et al. "A Novel Vertical Deep Trench RESURF DMOS (VTS–DMOS)" IEEE ISPD 2000, May 22–25, Toulouse France, pp. 197–200.

"IR develops CoolMOS™–equivalent technology, positions it at the top of a 3–tiered line of new products for SMPS," International Rectifiers company information available at http://www.irf.com (1999) 3 pages total.

Kao et al. "Two Dimensional Thermal Oxidation of Silicon–I. Experiments,", *IEEE Transactions on Electron Devices*, vol. ED–34,No. 5, May 1987, pp. 1008–1017.

Kao et al. "Two Dimensional Thermal Oxidation of Silicon–II. Modeling Stress Effects in Wet Oxides," *IEEE Transactions on Electron Devices*, vol. ED–35, No. 1, Jan. 1988, pp. 25–37.

Kassakian, J.G. et al., "High–frequency high–density converters for distributed power supply systems," (Apr., 1988) *Proceedings of the IEEE*, vol. 76, No. 4, pp. 362–376.

Korman, C.S. et al., "High performance power DMOSFET with integrated schottky diode," (1989) *Proc. IEEE Power Electronics Specialist Conf.* (*PESC*), pp. 176–179.

Lorenz et al., "COOL MOS–An important milestone towards a new power MOSFET generation" Power Conversion pp. 151–160 (1988).

Maksimovic, A.M. et al., "Modeling and simulation of power electronic converters," (Jun. 2001) *Proceedings of the IEEE*, vol. 89, No. 6, pp. 898–912.

Mehrotra, M. et al., "Very low forward drop JBS rectifiers fabricated using submicron technology," (Nov. 1993) *IEEE Transactions on Electron Devices*, vol. 40, No. 11, pp. 2131–2132.

Moghadam "Delivering Value Around New Industry Paradigms," Technical Literature from Applied Materials, pp. 1–11, vol. 1, Issue 2, Nov. 1999.

Park et al., "Lateral Trench Gate Super–Junction SOI–LDMOSFETs with Low On–Resistance," Institute for Microelectronics, University of Technology Vienna, Austria (2002), pp. 283–285.

Sakai et al., "Experimental investigation of dependence of electrical characteristics of device parameters in trench MOS barrier, schottky diodes," (1998) *International Symposium on Power Semiconductors and ICs, Technical Digest*, pp. 293–296.

Shenai et al., "Current transport mechanisms in atomically abrupt metal–semiconductor interfaces," (Apr. 1988) *IEEE Transactions on Electron Devices*, vol. 35, No. 4, pp. 468–482.

Shenai et al., "Monolithically integrated power MOSFET and schottky diode with improved reverse recovery characteristics," (Apr. 1990) *IEEE Transactions on Electron Devices*, vol. 37, No. 4, pp. 1167–1169.

Shenov et al."Analysis of the Effect of Charge Imbalance on the Static and Dynamic Characteristic of the Super Junction MOSFET," IEEE International Symposium on Power Semiconductor Devices 1999, pp. 99–102 (1999).

Singer "Empty Spaces in Silicon (ESS): An Alternative to SOI," Semiconductor International p. 42, Dec. 1999.

Tabisz et al., "A MOSFET resonant synchronous rectifier for high–frequency dc/dc converters," (1990) *Proc. IEEE Power Electronics Specialist Conf.* (*PESC*), pp. 769–779.

Technical Literature from Quester Technology, Model APT–300mm Atmospheric TEOS/Ozone CVD System, (unknown date), 3 pages total.

Technical Literature from Quester Technology, Model APT–6000 Atmospheric TEOS–Ozone CVD System, (unknown date), 2 pages total.

Technical Literature from Silicon Valley Group Thermal Systems, APNext, High Throughput APCVD Cluster Tool for 200 mm/300mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813–2814 2 pages total.

Ueda et al. "An Ultra–Low On–Resistance Power MOSFET Fabricated by Using a Fully Self–Aligned Process," IEEE Transactions on Electron Devices 34:926–930 (1987).

Wilamowski "Schottky Diodes with High Breakdown Voltages," Solid–State Electronics 26:491–493 (1983).

Wolf, "Silicon Processing for The VLSI Era" vol. 2 Process Integration Lattice Press (1990), 3 pages total.

Yamashita et al., Conduction Power loss in MOSFET synchronous rectifier with parallel–connected schottky barrier diode, (Jul. 1998) *IEEE Transactions on Power electronics*, vol. 13, No. 4, pp. 667–673.

* cited by examiner

METHOD FOR FORMING A SEMICONDUCTOR STRUCTURE WITH IMPROVED SMALLER FORWARD VOLTAGE LOSS AND HIGHER BLOCKING CAPABILITY

CROSS-REFERENCE TO RELATED APPLICATIONS

This application is a divisional of and claims priority to U.S. application Ser. No. 09/981,583, filed Oct. 17, 2001 now U.S. Pat. No. 6,677,641, entitled "Semiconductor Structure with Improved Smaller Forward Voltage Loss and Higher Blocking Capability", which disclosure is incorporated herein by reference.

FIELD OF THE INVENTION

This invention relates in general to semiconductor technology, and in particular to semiconductor devices and their manufacture.

BACKGROUND OF THE INVENTION

In a conventional vertical MOSFET (metal oxide semiconductor field effect transistor) device, it is desirable to minimize the drain-to-source resistance or $R_{DS(on)}$ of the device. $R_{DS(on)}$ is proportional to the amount of power consumed while the MOSFET device is on so that reducing $R_{DS(on)}$ reduces the amount of power consumed by the MOSFET device. $R_{DS(on)}$ could be reduced by increasing the dopant (or carrier) concentration in the drift region of the device. However, it may not be desirable to increase the dopant concentration, because increasing the dopant concentration reduces the breakdown voltage of the device. Conversely, the carrier concentration in the drift region of the MOSFET device cannot be reduced to increase the breakdown voltage without also undesirably increasing $R_{DS(on)}$.

U.S. Pat. No. 5,216,275 describes semiconductor devices with increased breakdown voltages and improved on-resistance properties. The devices of the type described in this patent are referred to as "superjunction" devices. Each of the described superjunction devices comprises a composite buffer layer. The composite buffer layer has alternating doped P and N regions that are charge balanced. According to the scientific literature, superjunction transistor devices exhibit 5–100 times lower specific on-resistance ($R_{on,sp}$) than conventional high voltage MOSFET devices.

While such superjunction transistor devices exhibit high breakdown voltages and low on-resistance, they are difficult to manufacture. For a superjunction device to function properly, the alternating P and N doped regions in the composite buffer layer must be doped with the same amount of charge material to achieve a perfect charge balance. This is difficult to achieve in practice. See, for example, Shenoy et al., "Analysis of the Effect of Charge Imbalance on the Static and Dynamic Characteristics of the Super Junction MOSFET", *Proc. of the ISPSD* '99, pp. 95–98, 1999. In addition, because it is extremely difficult to precisely balance the doping in the composite buffer layer of a superjunction transistor device, the practical maximum electrical field achievable in the composite buffer layer is limited to approximately $2\times10^5$ V/cm. The practical maximum electrical field achieved by a superjunction transistor device limits its breakdown voltage.

It would be desirable to provide for an improved semiconductor device that is less difficult to manufacture and that has a higher breakdown voltage and a lower on-resistance than the superjunction devices described above.

SUMMARY OF THE INVENTION

Embodiments of the invention are directed to semiconductor devices and methods for making semiconductor devices.

Another embodiment of the invention is directed to a method for forming a semiconductor device, the method comprising: providing a semiconductor substrate having a first region of a first conductivity type; forming a region of a second conductivity type in the semiconductor substrate such that the first and second regions form a p-n junction; and forming first and second charge control electrodes adjacent to but insulated from one of the first and second regions, along dimension parallel to flow of current through the semiconductor device, wherein the first charge control electrode is adapted to be biased differently than the second charge control electrode.

Another embodiment of the invention is directed to a method for forming a field effect transistor comprising: a) providing a semiconductor substrate of a first conductivity type having a major surface, a drift region, and a drain region; b) forming a well region of a second conductivity type in the semiconductor substrate; c) forming a source region of the first conductivity type in the well region; d) forming a source contact layer on the source region; e) forming a gate electrode adjacent to the source region; f) forming a charge control electrode in the drift region, wherein the charge control electrode is adapted to be biased at a different potential than the gate electrode or the source contact layer, and is adapted to control the electric field in the drift region; and g) forming a dielectric material around the charge control electrode.

These and other embodiments of the invention will be described with reference to the following Figures and Detailed Description.

BRIEF DESCRIPTION OF THE DRAWINGS

FIG. 2(*b*) shows a graph of electrical field and breakdown potential vs. distance (in microns) in a vertical trench MOSFET device according to a conventional vertical trench MOSFET device without charge control electrodes.

Figure 1:
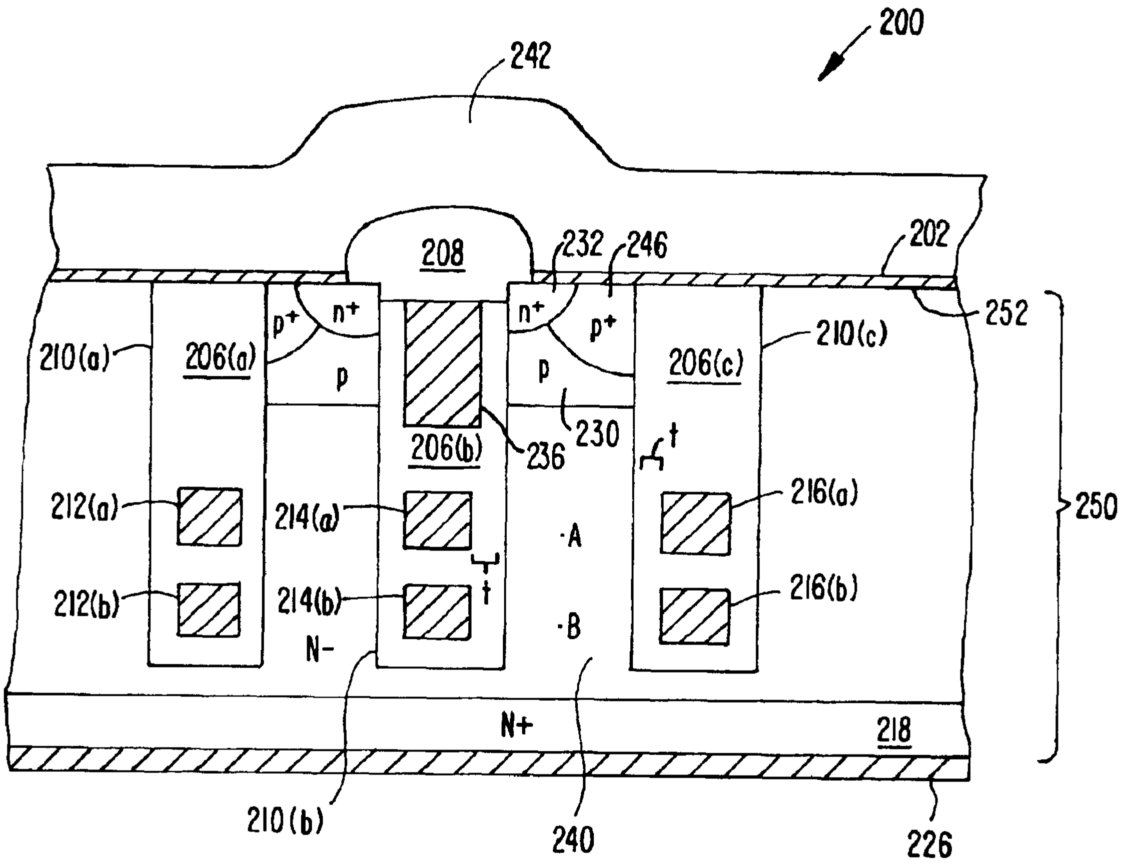
FIG. 1 shows a cross-sectional view of a vertical trench MOSFET device according to an embodiment of the invention.

These and other embodiments of the invention are described in further detail below.

DETAILED DESCRIPTION

Embodiments of the invention are directed to semiconductor devices. The semiconductor devices are preferably power semiconductor devices. Examples such semiconductor devices include vertical MOSFETs (e.g., planar gated or trench gated vertical MOSFETs), lateral MOSFETs, bipolar transistors, power diodes, etc.

The semiconductor devices comprise a semiconductor substrate such as a silicon or gallium arsenide substrate. The semiconductor substrate comprises a region of a first conductivity type (e.g., an N-type region) and can have a major surface. A region of a second conductivity type (e.g., a P-type region) is also formed within the semiconductor substrate.

In embodiments of the invention, the semiconductor device includes one or more charge control electrodes. The charge control electrodes may be biased with a different potential than the gate, source, and drain to control the electric field within the semiconductor material. In some embodiments, these charge control electrodes may be referred to as "field plates". The spacing and arrangement of the charge control electrodes can be set up in various stripe or cellular designs. In some embodiments, the sidewalls of each charge control electrode may be substantially parallel.

In preferred vertical semiconductor device embodiments, the charge control electrodes are stacked and buried within the semiconductor substrate. The stack of charge control electrodes is oriented generally vertically with respect to the major surface of the semiconductor substrate. A dielectric material is disposed around each of the stacked charge control electrodes to separate each of the charge control electrodes from the semiconductor material in the semiconductor substrate. In horizontal semiconductor device embodiments, the charge control electrodes can be laterally disposed on or in the semiconductor substrate and need not be stacked. In both the vertical and horizontal embodiments, the orientation of the plurality of charge control electrodes can be generally parallel to the direction of current flow in the drift region.

In some embodiments of the invention, there may be first, second, third, etc. pluralities of charge control electrodes. Each plurality of charge control electrodes can be embedded in a separate dielectric material structure. These different pluralities of charge control electrodes can be located at any suitable place in the semiconductor device. For example, in a vertical MOSFET device, the different pluralities of stacked charge control electrodes can be disposed under a gate of the device, and/or to the side of the gate. The different pluralities of charge control electrodes can function independently of each other or together to alter the electric field within the semiconductor substrate.

Each charge control electrode in a plurality of charge control electrodes is adapted to be biased differently than other charge control electrodes in the same plurality of charge control electrodes. The differently biased charge control electrodes can be used to adjust the electric field within the semiconductor substrate. When a vertical MOSFET device is in a blocking state, for example, the charge control electrodes within a plurality of charge control electrodes can be differently biased to maintain a substantially uniform and high electric field within the drift region of the semiconductor substrate. By maintaining a substantially uniform electric field within the drift region, the breakdown voltage of the vertical MOSFET device is increased. The drift region can be highly doped to reduce the on-resistance of the semiconductor device without compromising the breakdown voltage properties of the device. Accordingly, in embodiments of the invention, semiconductor devices having high breakdown voltages and/or low on-resistance properties can be produced.

Embodiments of the invention have a number of advantages over conventional semiconductor devices (e.g., vertical MOSFET devices). For example, in embodiments of the invention, the charge control electrodes are used for charge spreading in the semiconductor substrate. Charge spreading in the drift region of a device is controlled by the bias of the charge control electrodes, which can be set precisely. Consequently, the maximum electric field in the semiconductor substrate can be much greater than about $2\times10^5$ V/cm, the maximum practical electric field achievable by superjunction devices. In embodiments of the invention, the maximum electric field that can be created in the semiconductor substrate is limited only by the ability of the dielectric material surrounding the charge control electrodes to support the voltages of the charge control electrodes. The maximum electric field achievable in embodiments of the invention can easily exceed $3.5\times10^5$ V/cm, a value greater than the electric field achievable in a superjunction device. Another advantage of the proposed structure is the relative ease of making narrow charge distribution regions in the semiconductor substrate. This improves the usage and efficiency of the semiconductor substrate. Also, the semiconductor devices according to embodiments of the invention do not require the use of a composite buffer layer with precisely doped regions of opposite conductivity types. Accordingly, the problems associated with manufacturing precisely doped regions of opposite conductive types are reduced or eliminated. Furthermore, in embodiments of the invention, the semiconductor devices can have breakdown ratings in the low to mid voltage ranges, while exhibiting low on-resistance. For example, for a 150V N-channel power MOSFET, the on-resistance per unit area of embodiments of the invention has been simulated to be 50% less than the on-resistance per unit area of conventional 150V N-channel power MOSFETs. While superjunction devices have low on-resistance properties, the precise doping requirements of superjunction devices have prevented them from being made with breakdown voltage ratings in lower to mid voltage ranges (e.g., <200 V). The lower the voltage at which diffused P/N columns are used, the smaller the pitch that is required. Thermal processing makes such small-pitch structures difficult to form because of inevitable inter-dopant diffusion problems. Embodiments of the invention do not have such limitations.

FIG. 1 shows a cross-sectional view of a trench MOSFET device 200 according to an embodiment of the invention. The MOSFET device 200 includes a semiconductor substrate 250 that has a major surface 252. The semiconductor substrate 250 is of a first conductivity type. In this example, the first conductivity type is N-type and the semiconductor substrate 250 includes an $N^-$ drift region 240 and an $N^+$ drain region 218. The drift region 240 can correspond to the "epitaxial" or "epi" layer in a vertical MOSFET device. A drain electrode 226 is adjacent to the drain region 218 and may serve as a drain terminal for the trench MOSFET device 200.

The trench MOSFET device 200 includes a well region 230 of a second conductivity type and a source region 232 formed in the well region 230. In this example, the second conductivity type is P-type and the source region 232 has $N^+$ doping. A $P^+$ heavy body region 246 may also be formed in the semiconductor substrate 250.

A gate structure 236 is formed in a trench 210(*b*) and may therefore be considered a trenched gate structure. The gate structure 236 may comprise any suitable conductive material including doped or undoped polysilicon, or metal (e.g., refractory metals). In this example, the gate structure 236 fills a U-groove in a dielectric material 206(*b*) in the trench 210(*b*). In other embodiments, the gate structure could fill a V-groove in a dielectric material. The dielectric material 206(*b*) that surrounds the gate structure 236 may comprise one or more of, for example, silicon dioxide, silicon nitride, glass, etc.

A dielectric cap structure 208 covers the gate structure 236 to isolate the gate structure 236 from the source region 232. The dielectric cap structure 208 may comprise, for example, borosilicate glass. A source contact layer 202 can contact the $N^+$ source region 232. The source contact layer 202 can comprise a material such as tungsten, or a polycide. A source metal layer 242 may comprise a metal such as aluminum and can cover the source contact layer 202, as well as the dielectric cap structure 208.

A plurality of trenches 210(*a*)–210(*c*) is formed in the semiconductor substrate 250. Each of the trenches 210(*a*)–210(*c*) extends from the major surface 252 and into the drift region 240. The bottoms of the trenches 210(*a*)–210(*c*) are above the drain region 218, but could extend into the drain region 218.

Different pluralities of charge control electrodes are in the MOSFET device. Each charge control electrode may be formed of any suitable material. For example, the charge control electrodes can be formed from doped or undoped polysilicon, or metal.

In the example shown in FIG. 1, a first plurality of charge control electrodes 212(*a*)–212(*b*), a second plurality of charge control electrodes 214(*a*)–214(*b*), and a third plurality of charge control electrodes 216(*a*)–216(*b*) are respectively disposed in first, second, and third of trenches 210(*a*)–210(*c*). Charge control electrodes within a common trench are shown in a stacked relationship. The charge control electrodes are separated from each other and from the $N^-$ drift region 240 by the dielectric material 206(*a*)–206(*c*) within each of the trenches 210(*a*)–210(*c*). Charge control electrodes within different pluralities of charge control electrodes can be at about the same vertical distance from the major surface 252. For example, charge electrodes 212(*a*), 214(*a*), and 216(*a*) may be at the same vertical position within the semiconductor substrate 252.

In this example, each plurality of charge control electrodes in each trench consists of two charge control electrodes. Although two charge control electrodes are shown in each of the trenches 210(*a*)–210(*c*) in the embodiment illustrated in FIG. 1, it is understood that any suitable number of charge control electrodes can be present in each trench in embodiments of the invention. For example, in some embodiments of the invention, there may be three, four, five, etc. vertically stacked charge control electrodes in each trench. In general, a more uniform electric field can be created in the drift region 240 if there are more charge control electrodes per stack of charge control electrodes.

In other embodiments (e.g., the field effect transistor embodiments), there can be one charge control electrode (e.g., per trench) buried in the drift region of a device. The one charge control electrode may be disposed directly under a gate electrode or could be disposed to a side of a gate electrode. In a field effect transistor, the one or more charge control electrodes are preferably biased at a different potential than the source contact metal, the gate electrode and/or the drain electrode.

In the MOSFET device embodiments including a gate electrode, one or more charge control electrodes can be located at any suitable region. For example, the charge control electrodes may be disposed, for example, (i) to one or both sides of the gate electrode and not directly under the gate electrode, (ii) only directly under the gate electrode, but not to the sides of the gate electrode, or (iii) directly under the gate electrode and to the sides of the gate electrode. As noted above, gate electrode may be trenched or planar.

Each of the charge control electrodes 212(*a*)–212(*b*), 214(*a*)–214(*b*), 216(*a*)–216(*b*) can be individually biased with biasing elements (not shown) that may be formed in or on the semiconductor substrate 250. The biasing elements may bias the charge control electrodes 212(*a*)–212(*b*), 214(*a*)–214(*b*), 216(*a*)–216(*b*) at potentials that are different from the source contact metal 202, the gate electrode 236, and/or the drain electrode 226. Any suitable biasing element could be used to bias the charge control electrodes. For example, the biasing elements can be resistors with different resistance values in a voltage divider. Alternatively, the biasing elements could be a series of diodes with different voltage ratings. Examples of suitable diodes can be found in U.S. Pat. No. 5,079,608, which is herein incorporated by reference in its entirety. In some embodiments, the biasing elements may be coupled to the charge control electrodes. For example, the source electrode 242 could be tapped with the biasing elements to provide the charge control electrodes 212(*a*)–212(*b*), 214(*a*)–214(*b*), 216(*a*)–216(*b*) with appropriate bias voltages. The biasing elements could also be coupled to the gate electrode 216, or the drain electrode 226.

The biased charge control electrodes 212(*a*)–212(*b*), 214(*a*)–214(*b*), 216(*a*)–216(*b*) in each trench 210(*a*)–210(*c*) can be used to alter the electrical field within the drift region 240 of the semiconductor substrate 250. When the device 200 is in the blocking state, the biased charge control electrodes 212(*a*)–212(*b*), 214(*a*)–214(*b*), 216(*a*)–216(*b*) alter the electrical field within the drift region 240 so that the resulting electrical field profile in the drift region 240 is higher and more uniform if no charge control means were present in the drift region 218. Preferably, the biased charge control electrodes 212(*a*)–212(*b*), 214(*a*)–214(*b*), 216(*a*)–216(*b*) alter the electrical field within the drift region 240 so that the electrical field is high and is substantially uniform throughout a substantial portion of the drift region 218 or at least in the zones where current flows through the drift region 240 from the source regions 232 to the drain region 218.

The electric field in the drift region can be governed by the following equation where E is the electric field, $V_S$ is the voltage at a point in the semiconductor substrate, $V_{CCE}$ is the voltage in the charge control electrode, and d is the thickness of the dielectric material between the point in the semiconductor substrate and the charge control electrode:

$$E = \frac{V_S - V_{CCE}}{d}$$

In an illustrative example, referring to FIG. 1, a generally constant electric field of about $3.0\times10^5$ V/cm in the drift region 240 may be produced using the charge control electrodes 214(*a*)–214(*b*), 216(*a*)–216(*b*). The thickness t of the dielectric material 206(*b*), 206(*c*) in the trench 210(*b*), 210(*c*) may be about 1 micron. At point A in the drift region 240, the semiconductor may have a potential of about 40 V while the potential at point B in the drift region 240 may be about 60V. To maintain a constant, horizontally oriented electrical field of about $3.0\times10^5$ V/cm in the drift region 240, first charge control electrodes 214(*a*), 216(*a*) in the respective trenches 210(*b*), 210(*c*) can be biased to 10V while second charge control electrodes 214(*b*), 216(*b*) can be biased to 30V. As illustrated in this example, the bias voltage applied to the different, individual charge control electrodes can increase from the P body/$N^-$ drift junction towards the drain region. As shown in this example, in some embodiments, charge control electrodes at the same vertical position in a semiconductor substrate, but within different pluralities of charge control electrodes, can be biased at about the same voltage. For example, in the MOSFET device 200 in FIG. 1, lower charge control electrodes 212(*b*), 214(*b*), 216(*b*) can be similarly biased. However, in some embodiments, the bias voltage applied to the lower charge control electrodes 212(*b*), 214(*b*), 216(*b*) would be different than the bias voltage applied to the upper charge control electrodes 212(*a*), 214(*a*), 216(*a*).

Using differently biased charge control electrodes in the drift region of a semiconductor device "flattens" out the electric field profile across the drift region (as compared to the electric field profile that would be present in a drift region without the charge control electrodes). If the charge control electrodes are not present, the electric field profile would be "triangular" across the drift region. In a conventional device, the electric field is at a maximum at the body/drift or well/drift PN junction and is at a minimum at the drain region. The electric field profile then decreases linearly from the PN junction to the drain region. The present inventor has determined that a flatter and higher electric field profile across the drift region of a semiconductor device leads to increased breakdown voltages. The flatter and higher electric field in the drift region can be produced using charge control electrodes. In general, the use of more differently biased, charge control electrodes in the drift region can result in a more uniform electric field in the drift region.

Figure 2A:
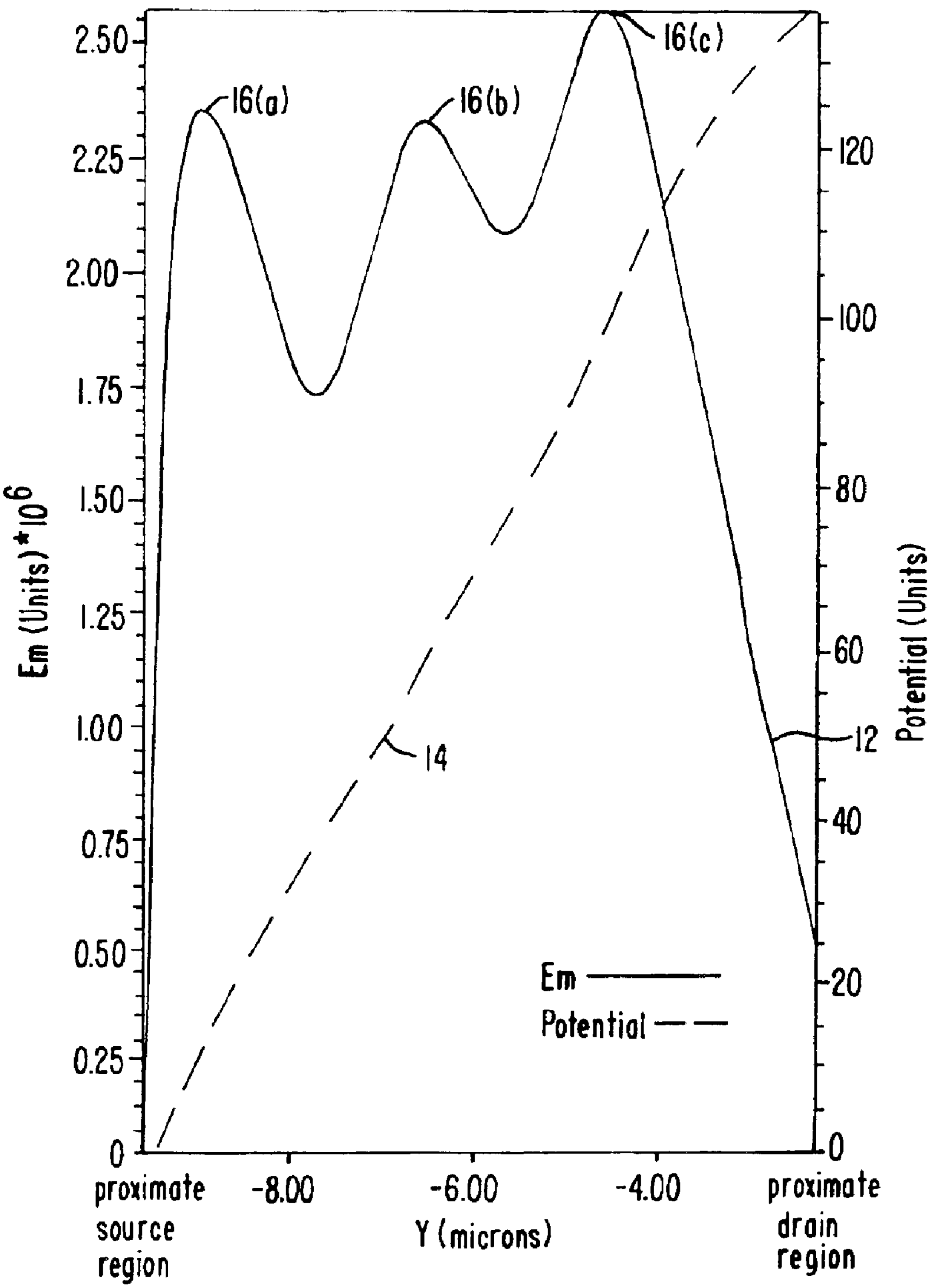
FIG. 2(*a*) shows a graph of electrical field and breakdown potential vs. distance (in microns) in a vertical trench MOSFET device according to an embodiment of the invention.
Figure 2B:
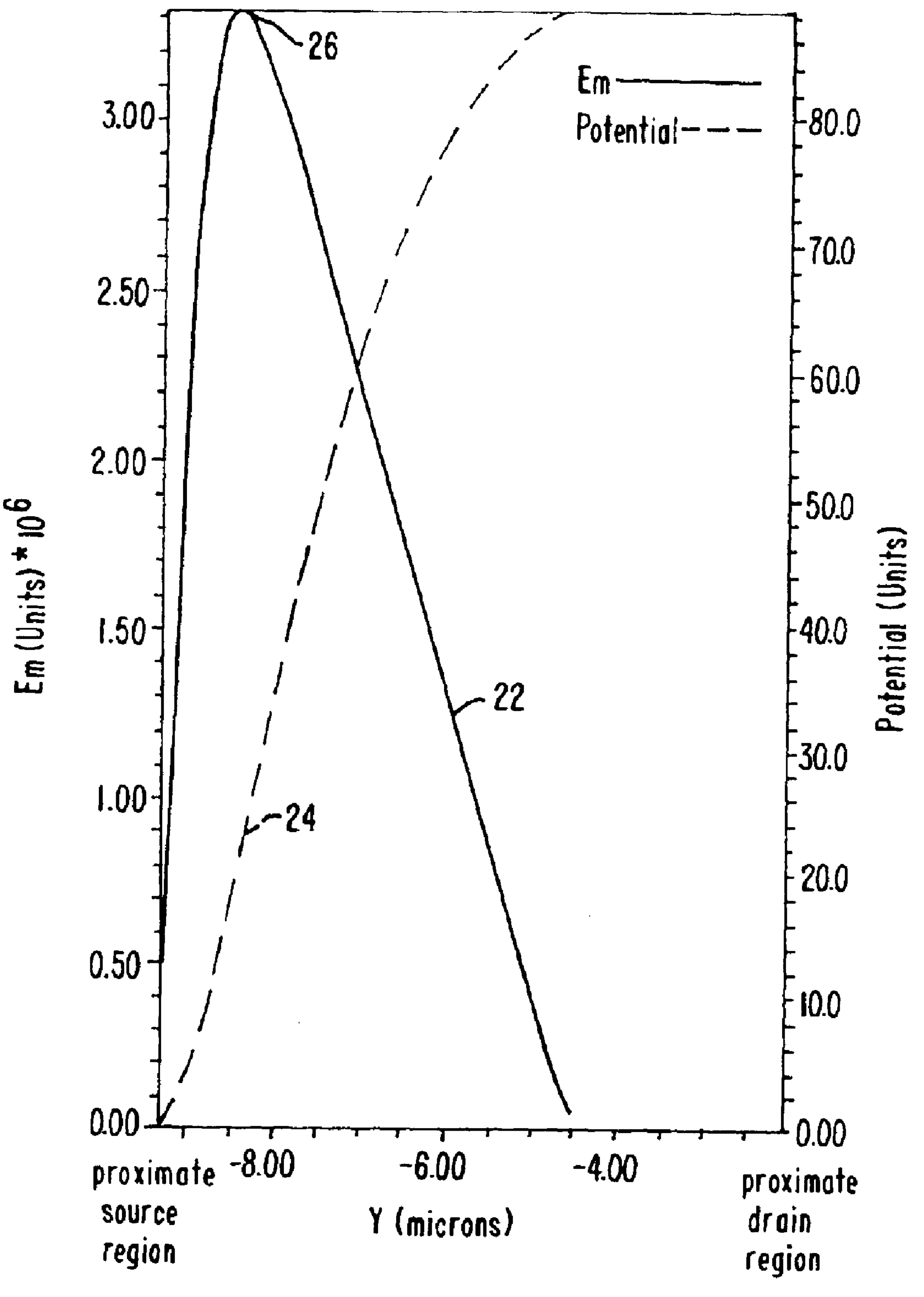

Illustratively, FIG. 2(*a*) shows a graph of electrical field and breakdown potential vs. vertical distance through the vertical trench power MOSFET device with two stacked charge control electrodes. The graph is the result of a computer simulation. Lower values on the x-axis (i.e., Y(microns)) represent points in the semiconductor substrate that are proximate the source region of the MOSFET device while the higher values represent points that are proximate the drain region. The values on the x-axis of the graph represent a particular vertical position in the semiconductor substrate.

The graph shown in FIG. 2(*a*) has two lines, a first line 12 of the electrical field (Em) as a function of distance and a second line 14 showing breakdown potential as a function of distance. The first line 12 includes a peak 16(*a*) corresponding to the electric field at a PN junction in the semiconductor substrate (e.g., a P well/N drift diode). Peak 16(*b*) can correspond to the local maximum electric field due to a first charge control electrode (e.g., charge control electrode 216 (*a*) in FIG. 1). The first charge control electrode may be biased to, for example, 25V. Peak 16(*b*) can correspond to the local maximum electric field due to a second charge control electrode (e.g., charge control electrode 216(*b*) shown in FIG. 1). The second charge control electrode can be biased to, for example, 64V. As shown in FIG. 2(*a*), the first line 12 has a generally trapezoidal shape. It has local maxima where the charge control electrodes and a PN junction are present, and also saddles between the local maxima. If more charge control electrodes are used, the top of the trapezoidal shape would be flatter and less saddled. The second line 14 shows that the breakdown potential is smaller near the PN junction and is larger closer to the drift region of the semiconductor device. As shown by the second line 14, the breakdown potential rises slowly through the drift region.

In comparison, FIG. 2(*b*) shows a graph of electrical field and breakdown potential vs. vertical distance for a conventional vertical MOSFET device (without charge control electrodes) as produced by a computer simulation. The graph includes a first line 22 and a second line 24. The first line 22 is a function of electrical field vs. distance while the second line 24 is a function of breakdown voltage vs. distance. As shown by the first line 22, a maximum 26 electrical field is present at the PN junction in the MOSFET device and the electrical field decreases toward the drain region. The first line 22 shows that the electrical field profile through the thickness of the semiconductor device is "triangular" instead of generally flat as shown in FIG. 2(*a*). The second line 24 shows that the breakdown voltage rises quickly through the drift region.

A comparison of the graph functions for the breakdown potential vs. distance shows that the breakdown potential rises faster towards the drain region in the conventional MOSFET device than the MOSFET device according to an embodiment of the invention. Compare, for example, line 14 in FIG. 2(*a*) and line 26 in FIG. 2(*b*). The computer simulations indicate that embodiments of the invention will have a higher breakdown voltage than MOSFET devices that do not have charge control electrodes. For example, computer simulations have indicated that, for the same drift region carrier concentration, the breakdown voltage of a conventional MOSFET device was about 80 V while the breakdown voltage of a MOSFET device with charge control electrodes was estimated to be about 138 V.

Various other device embodiments with charge control electrodes can be described with reference to FIGS. 3 to 6.

Figure 3:
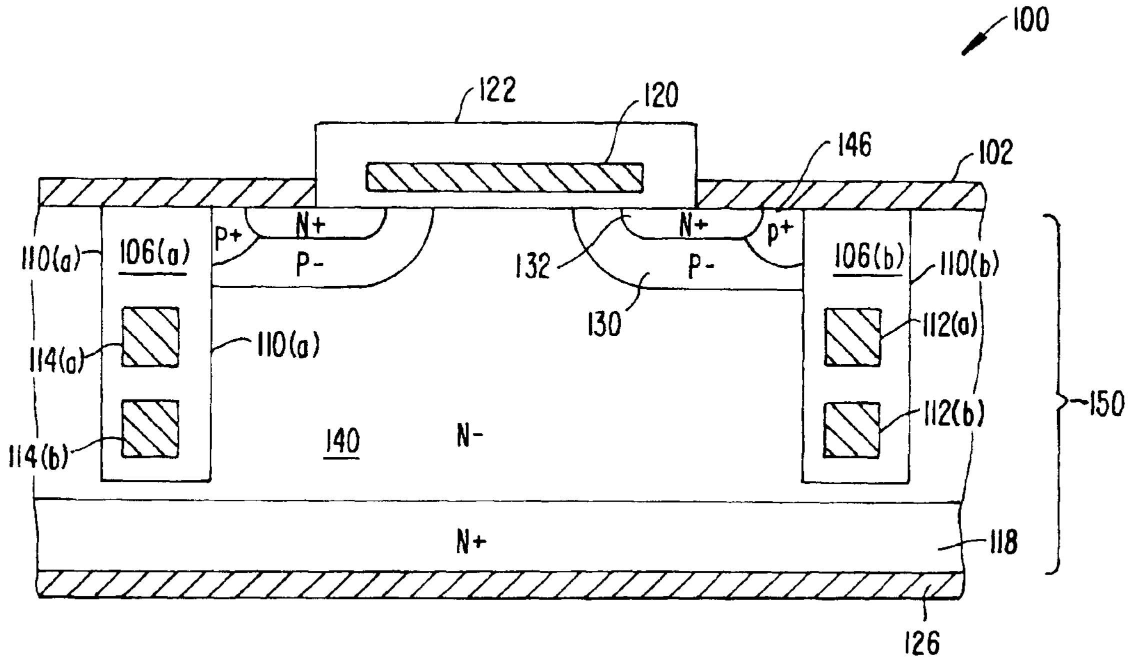
FIG. 3 shows a cross-sectional view of a vertical planar MOSFET device according to an embodiment of the invention.

FIG. 3 shows a vertical MOSFET 100 according to another embodiment of the invention. The vertical MOSFET 100 also includes a semiconductor substrate 150 with a $P^+$ well region 130 and an $N^+$ source region 132 formed therein. A $P^+$ body region 146 is also proximate the $N^+$ source region 132. A drain region 118 and a drift region 140 are also present in the semiconductor substrate 150. A drain electrode 126 contacts the $N^+$ drain region 118 while a source metal 102 contacts the $N^+$ source region 132. In this Figure, the vertical MOSFET 100 has a planar gate structure 120 surrounded by a gate oxide 122 Also, in this example, there are no charge control electrodes beneath the planar gate structure 120.

Two trenches 110(*a*)–110(*b*) are disposed at opposite sides of the gate structure 120. Each trench 110(*a*)–110(*b*) includes stacked, charge control electrodes 112(*a*)–112(*b*), 114(*a*)–114(*b*) that are isolated from each other and from the semiconductor material in the drift region 140 by a dielectric material 106(*a*), 106(*b*). As noted above, although two charge control electrodes 112(*a*)–112(*b*), 114(*a*)–114(*b*) are present per trench or per plurality of charge control electrodes in this example, there may be three, four, five, etc. or more charge control electrodes per trench or per plurality of charge control electrodes in other embodiments.

The charge control electrodes 112(*a*)–112(*b*), 114(*a*)–114 (*b*) can be appropriately biased to form a substantially uniform electric field within the drift region 140 of the vertical MOSFET device 100. Biasing elements (not shown) such as diodes or a voltage divider can be used to appropriately bias the charge control electrodes 112(*a*)–112(*b*), 114(*a*)–114(*b*). The biasing elements can be coupled to the source, gate, or drain of vertical MOSFET device 100.

Figure 4:
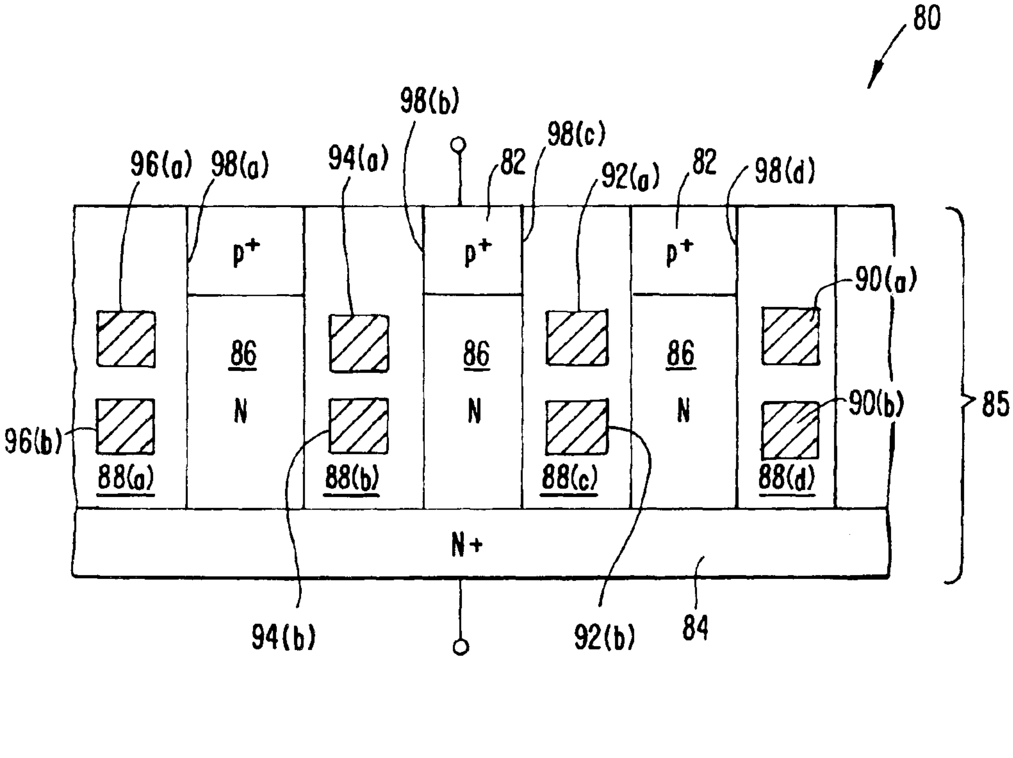
FIG. 4 shows a cross-sectional view of a power diode device according to an embodiment of the invention.

FIG. 4 shows a power diode 80 according to an embodiment of the invention. The power diode 80 includes a semiconductor substrate 85 with a first region 86 of a first conductivity type and a second region 82 of a second conductivity type. In this example, the first region 86 has N doping and the second region 82 has $P^+$ doping. The semiconductor substrate 85 also includes a contact region 84 of the first conductivity type (i.e., an $N^+$ region).

A plurality of trenches 98(*a*)–98(*d*) are formed in the semiconductor substrate 85. Each trench 98(*a*)–98(*d*) may extend from a major surface of the semiconductor substrate 85 to a predetermined distance into the semiconductor substrate 85.

Each trench 98(*a*)–98(*d*) contains a plurality of stacked, charge control electrodes 90(*a*)–90(*b*), 92(*a*)–92(*b*), 94(*a*)–94(*b*), 96(*a*)–96(*b*). Like the previously described embodiments, the charge control electrodes may be differently biased using biasing elements (not shown). A dielectric material 88(*a*)–88(*d*) (e.g., silicon dioxide) may be in each of the trenches 98(*a*)–98(*d*) to isolate the charge control electrodes 90(*a*)–90(*b*), 92(*a*)–92(*b*), 94(*a*)–94(*b*), 96(*a*)–96 (*b*) from semiconductor material in the first region 86 of the first conductivity type.

The differently biased charge control electrodes 90(*a*)–90 (*b*), 92(*a*)–92(*b*), 94(*a*)–94(*b*), 96(*a*)–96(*b*) can form a uniform electric field throughout the first region 86 of the first conductivity type to increase the breakdown voltage of the power diode 80. Like the prior embodiments, the first region 86 of the first conductivity type can be more heavily doped to decrease the resistance in the power diode's forward bias state, while increasing the blocking voltage in the power diode's reverse bias state.

Figure 5:
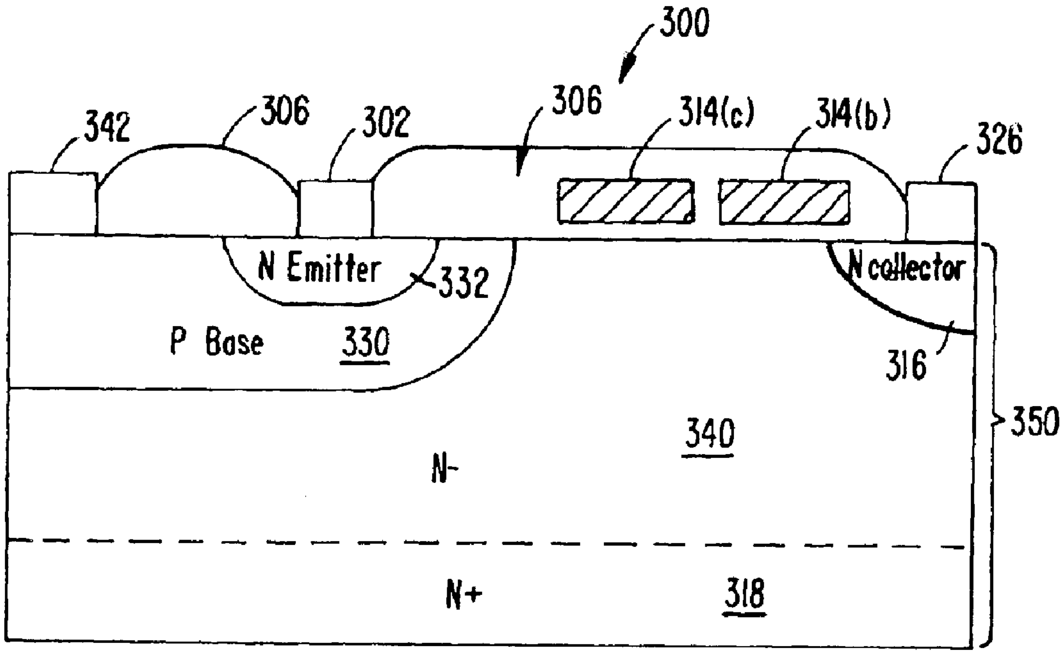
FIG. 5 shows a cross-sectional view of a bipolar transistor according to an embodiment of the invention.

FIG. 5 shows a cross-sectional view of a bipolar transistor 300 according to an embodiment of the invention. The bipolar transistor 300 includes a semiconductor substrate 350 with an $N^-$ drift region (or $N^-$ epi region) 340 and an $N^+$ region 318.

The semiconductor substrate 350 also includes an N emitter region 332 formed within a P base region 330. A base metal 342 is coupled to the P base region 330 and an emitter metal 302 is coupled to the emitter region 332. An N collector region 316 and a collector metal 326 are spaced from the emitter metal 302 and the N emitter region 332.

An interlevel dielectric layer 306 isolates the base metal 342 and the emitter metal 302. The interlevel dielectric layer 306 also encapsulates biased charge control electrodes 314 (*a*), 314(*b*). Biasing elements (not shown) may be adapted to bias the charge control electrodes 314(*a*), 314(*b*) with different potentials. The biasing elements may be coupled to the base metal 342, source emitter metal 302, or the collector metal 326. When the charge control electrodes 314(*a*), 314(*b*) are properly biased, they can control the electric field within the area of the drift region 340 between the P-base 330 and the N collector region 316.

In alternative embodiments, the charge control electrodes 314(*a*), 314(*b*) could be buried in the drift region 340 of the bipolar transistor 300. A dielectric material can cover the buried charge control electrodes.

Figure 6:
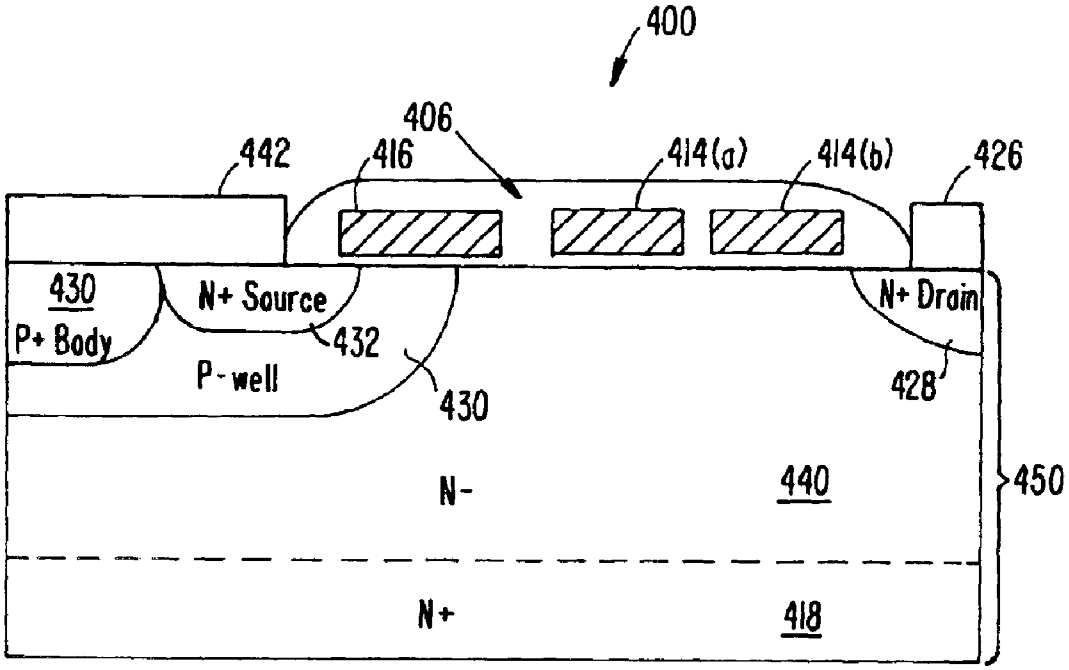
FIG. 6 shows a cross-sectional view of a lateral MOSFET according to an embodiment of the invention.
Figure 7A:
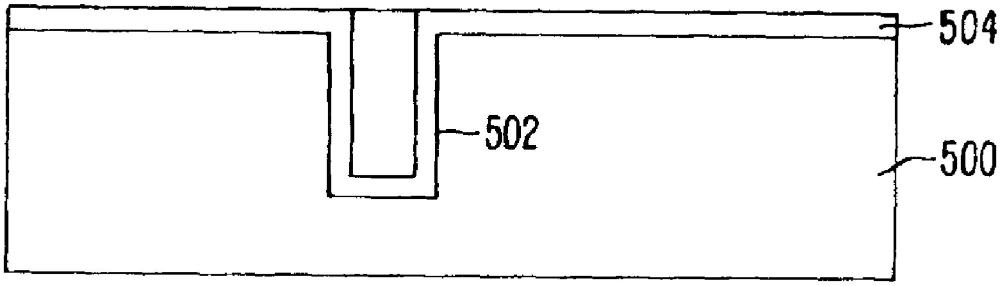
FIGS. 7(*a*)–7(*i*) show cross-sections of semiconductor substrates as stacked electrodes are formed within them.
Figure 7B:
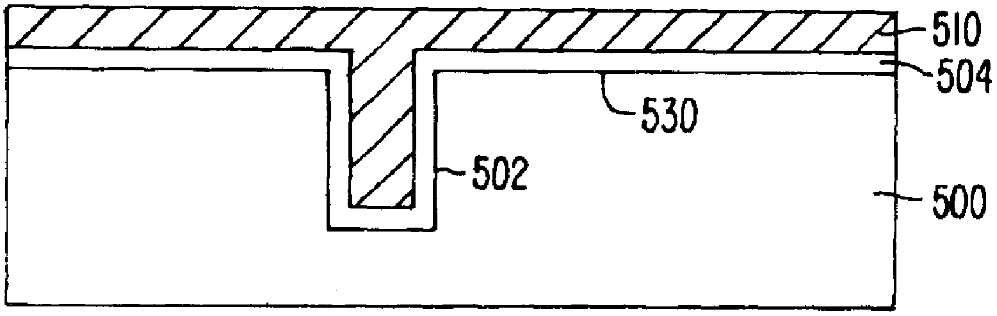
Figure 7C:
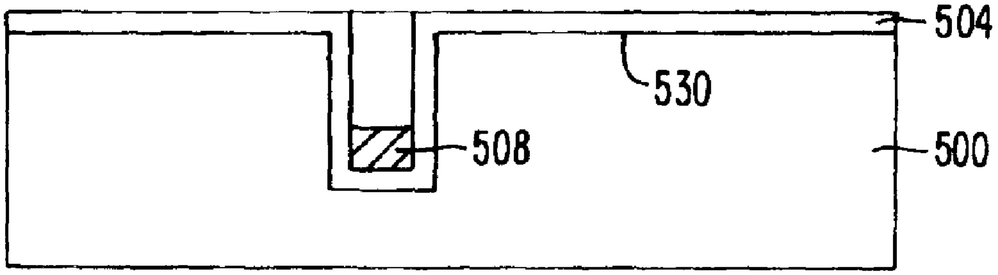
Figure 7D:
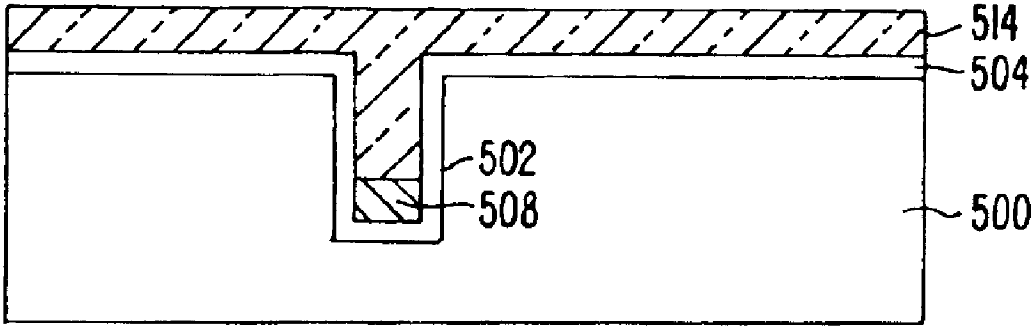
Figure 7E:
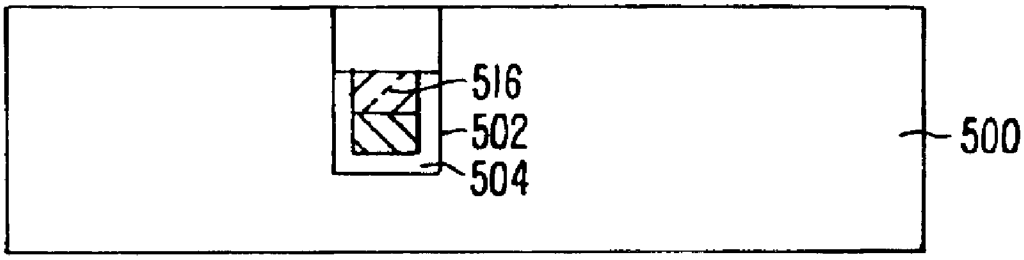
Figure 7F:
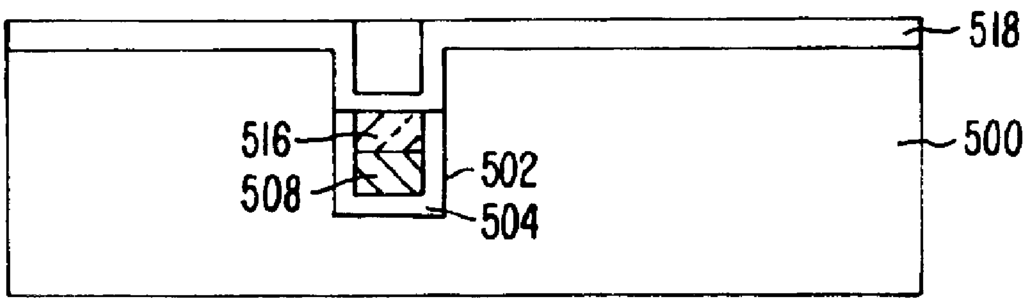
Figure 7G:
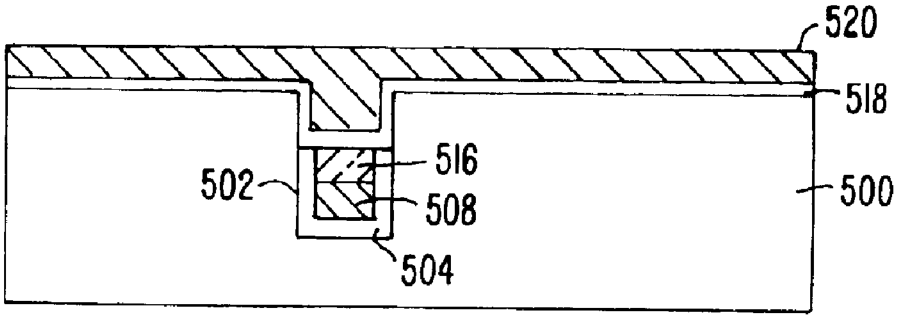
Figure 7H:
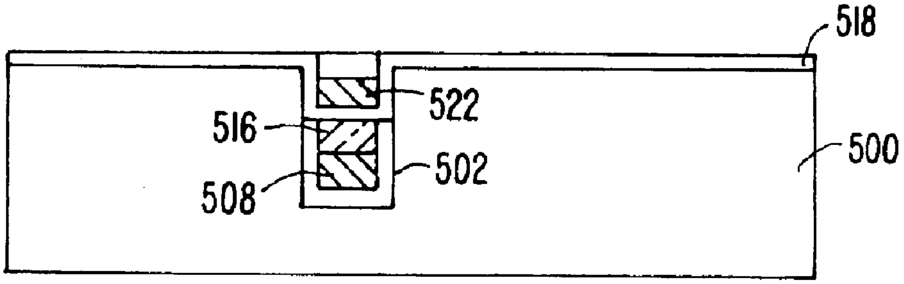
Figure 7I:
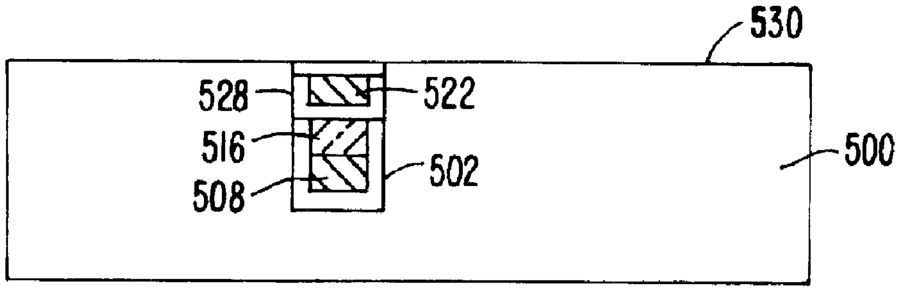

FIG. 6 shows a lateral MOSFET device 400 according to an embodiment of the invention. The lateral MOSFET 400 includes a semiconductor substrate 450 with an $N^-$ drift region 440 and a $N^+$ region 418. A $P^-$ well region 430 is formed in the semiconductor substrate 450. A $P^+$ body region 430 and an $N^+$ source region 432 are formed within the $P^-$ well region 430. An $N^+$ drain region 428 is separated from the $P^-$ well region 430 by the drift region 440. A source metal 442 and a drain metal 426 are respectively coupled to the $N^+$ source region 432 and the $N^+$ drain region 428.

A planar gate structure 416 is between the $N^+$ source region 432 and the $N^+$ drain region 428. Biased electrodes 414(*a*), 414(*b*) are spaced from the major surface of the semiconductor substrate 450. The biased electrodes 414(*a*), 414(*b*) and the planar gate structure are covered by an interlevel dielectric layer 406. Biasing elements (not shown) may be used to bias the electrodes 414(*a*), 414(*b*).

In alternative embodiments, the charge control electrodes 414(*a*), 414(*b*) could be buried in the drift region 440 of the MOSFET device 400. A dielectric material can cover the buried charge control electrodes.

Other embodiments of the invention are directed to methods for forming semiconductor devices with charge control electrodes. For example, in some embodiments, a semiconductor substrate having a first region of a first conductivity type is obtained. A second region of a second conductivity type is formed in the semiconductor substrate. Before or after forming the second region of the second conductivity type, a first charge control electrode and a second charge control electrode are formed. The first and second charge control electrodes may be adjacent to each other and may be formed in the semiconductor substrate or on the semiconductor substrate. The first charge control electrode is adapted to be biased differently than the first charge control electrode.

Exemplary method embodiments for forming stacked charge control electrodes within a trench in a semiconductor substrate can be described with reference to FIGS. 7(*a*) to 7(*i*).

Referring to FIG. 7(*a*), a semiconductor substrate 500 can first be obtained and a trench 502 can be etched in the semiconductor substrate 500. An anisotropic etching process can be used to form the trench 502. After forming the trench 502, a first oxide layer 504 is formed on the walls of the trench 502 and on the major surface of the semiconductor substrate 500. The first oxide layer 502 can be formed by, for example, an oxidation process or deposition process such as chemical vapor deposition (CVD).

Referring to FIG. 7(*b*), after forming the oxide layer 504, a polysilicon layer 510 can be formed on the semiconductor substrate 500 so that the trench 502 is filled with polysilicon. The polysilicon that fills the trench 502 can be used to form a first charge control electrode (not shown).

Referring to FIG. 7(*c*), after forming the polysilicon layer 510, a polysilicon recess etch can be performed to form a first charge control electrode 508. Typically, the polysilicon layer 510 is etched with a dry RIE (reactive ion etch) etch process. As shown in FIG. 7(*c*), the produced charge control electrode 508 is disposed well below the major surface 530 of the semiconductor substrate 500 and is also buried within the semiconductor substrate 500.

Referring to FIG. 7(*d*), after forming the first charge control electrode 508, a dielectric layer 514 can be deposited on the semiconductor substrate 500 to fill the empty spaces of the trench 502. The dielectric layer 514 may comprise, for example, glass such as BPSG (borophosphsilicate glass) or BSG (borosilicate glass). If glass is used, the glass can be deposited using, for example, a vapor deposition process with a subsequent reflow step. In the reflow step, the entire structure is heated to flow the glass so that it can fill the empty spaces of the trench 502. Alternatively, a dielectric material such as silicon oxide or silicon nitride could be used in the dielectric layer 514.

Referring to FIG. 7(*e*), after depositing the dielectric layer 514, it is etched with a suitable etchant in another recess etch process. The dielectric layer 514 is etched so that a dielectric structure 516 is on the first charge control electrode 508. The dielectric structure 516 can serve as a barrier between the first charge control electrode 508 and a later formed second charge control electrode (not shown).

Referring to FIG. 7(*f*), after forming the dielectric structure 516, a second oxide layer 518 can be formed on the semiconductor substrate 500. Like the previously described first oxide layer, the second oxide layer 518 can be formed using an oxidation process or a vapor deposition process (e.g., CVD).

Referring to FIG. 7(*g*), after forming the second oxide layer 518, another polysilicon layer 520 can be formed on the semiconductor substrate 500. The polysilicon layer 520 can be formed in the same or different manner as the previously described polysilicon layer.

Referring to FIG. 7(*h*), after the polysilicon layer 520 is formed, another recess etch process is performed to form a second charge control electrode 522. In this example, the second charge control electrode 522 is disposed below the major surface 530 of the semiconductor substrate 500. Both the first and second charge control electrodes 508, 522 are separated from each other and from the semiconductor material in the semiconductor substrate 500 by a dielectric material.

As shown in FIG. 7(*i*), after forming the second charge control electrode 522, a portion of the second oxide layer 518 can be removed so that the remaining portion is below the major surface of the semiconductor substrate 500. It is apparent that the general process sequence described herein could be used to form additional charge control electrodes on top of, or to the sides of the second charge control electrode 522.

After forming the first and second charge control electrodes 508, 522, various well known process steps used to form MOSFET devices (e.g., well formation, body formation, source formation, etc.) can be performed on the structure shown in FIG. 7(*i*). Alternatively, one or more MOSFET device process steps such as well formation, body formation, and source formation can be performed before the formation of the first and/or the second charge control electrodes 508, 522.

Additional details regarding the formation of well regions, gate structures, source regions, and heavy bodies are present in U.S. patent application Ser. No. 08/970,221 entitled "Field Effect Transistor and Method of Its Manufacture", by Brian Sze-Ki Mo, Duc Chau, Steven Sapp, Izak Bencuya, and Dean Edward Probst. This application is assigned to the same assignee as the assignee of the present application and the application is herein incorporated by reference in its entirety for all purposes.

The process sequence described with reference to FIGS. 7(*a*) to 7(*i*) can also be used to form a trench with a gate structure and a charge control electrode in the trench. For example, the charge control electrode 522 shown in FIG. 7(*h*) could be formed as a gate structure instead of a charge control electrode. In this case, there would be one charge control electrode 508 under the formed gate structure.

In some embodiments, field effect transistors can be formed by providing a semiconductor substrate of a first conductivity type having a major surface, a drift region, and a drain region. A well region of a second conductivity type is formed in the semiconductor substrate and a source region of the first conductivity type is formed in the well region. After forming the source region, a source contact layer is formed on the source region. Before or after these steps, a gate electrode is formed adjacent to the source region. Before or after forming the source region and/or the gate electrode, one or more charge control electrodes are formed and buried within the drift region. Each charge control electrode is adapted to be biased at a different potential than the gate electrode or the source contact layer, and each charge control electrode is adapted to control the electric field in the drift region. A dielectric material is formed around the charge control electrodes in one or more steps. The formation of charge control electrodes and a dielectric material covering charge control electrodes is shown in FIGS. 7(*a*) to 7(*i*).

Although a number of specific embodiments are shown and described above, embodiments of the invention are not limited thereto. For example, it is understood that the doping polarities of the structures shown and described could be reversed and/or the doping concentrations of the various elements could be altered without departing from the invention.

While the foregoing is directed to certain preferred embodiments of the present invention, other and further embodiments of the invention may be devised without departing from the basic scope of the invention. Such alternative embodiments are intended to be included within the scope of the present invention. Moreover, the features of one or more embodiments of the invention may be combined with one or more features of other embodiments of the invention without departing from the scope of the invention. For example, although the vertical device shown in FIG. 1 does not show charge control electrodes under the gate, charge control electrodes could be under the gate in other embodiments of the invention.

What is claimed is:

1. A method for forming a semiconductor device, the method comprising:

providing a semiconductor substrate having a first region of a first conductivity type;

forming a second region of a second conductivity type in the semiconductor substrate such that the first and second regions form a p-n junction; and forming first and second charge control electrodes adjacent to but insulated from one of the first and second regions, along a dimension parallel to flow of current through the semiconductor device, wherein the first charge control electrode is adapted to be biased differently than the second charge control electrode.

2. A method for forming a semiconductor device, the method comprising:

providing a semiconductor substrate having a first region of a first conductivity type;

forming a second region of a second conductivity type in the semiconductor substrate;

forming a trench in the semiconductor substrate;

forming a first charge control electrode in the trench by depositing a conductive material in the trench and then etching the deposited conductive material; and forming a second charge control electrode in the trench by depositing a conductive material in the trench and then etching the deposited conductive material, wherein the first charge control electrode is adapted to be biased differently than the second charge control electrode.

3. The method of claim 1 further comprising:

forming a trenched gate structure in the semiconductor substrate.

4. The method of claim 1 wherein the first and second charge control electrodes comprise polysilicon.

5. The method of claim 1 wherein the method further comprises forming a plurality of biasing elements on or in the semiconductor substrate, wherein the biasing elements are adapted to bias the first and second charge control electrodes at different voltages.

6. The method of claim 1 wherein the semiconductor device is a power MOSFET.

7. A method for forming a field effect transistor comprising:

a) providing a semiconductor substrate of a first conductivity type having a major surface, a drift region, and a drain region;

b) forming a well region of a second conductivity type in the semiconductor substrate;

c) forming a source region of the first conductivity type in the well region;

d) forming a source contact layer on the source region;

e) forming a gate electrode adjacent to the source region;

f) forming a charge control electrode in the drift region, wherein the charge control electrode is adapted to be biased at a different potential than the gate electrode or the source contact layer, and is adapted to control the electric field in the drift region; and g) forming a dielectric material around the charge control electrode.

8. The method of claim 7 wherein the gate electrode is a trenched gate electrode.

9. The method of claim 7 further comprising:

forming a biasing element, wherein the biasing element is adapted to bias the charge control electrode.

* * * * *